(12) United States Patent
Fu et al.

(10) Patent No.: US 7,719,275 B2
(45) Date of Patent: May 18, 2010

(54) METHOD FOR CALCULATING SIGNAL-TO-NOISE RATIO IN PARALLEL ACQUISITION IMAGE RECONSTRUCTION

(75) Inventors: Cai Xia Fu, Shenzhen (CN); Jian Min Wang, Shenzhen (CN); Bi Da Zhang, Shenzhen (CN); Qiang Zhang, Shenzhen (CN)

(73) Assignee: Siemens Aktiengesellschaft, Munich (DE)

( * ) Notice: Subject to any disclaimer, the term of this patent is extended or adjusted under 35 U.S.C. 154(b) by 51 days.

(21) Appl. No.: 12/152,571

(22) Filed: May 15, 2008

(65) Prior Publication Data

US 2008/0285833 A1 Nov. 20, 2008

(30) Foreign Application Priority Data

May 17, 2007 (CN) .................... 2007 1 0108505

(51) Int. Cl.
*G01V 3/00* (2006.01)
(52) U.S. Cl. ........................................ 324/309
(58) Field of Classification Search ......... 324/300–322; 600/410–435
See application file for complete search history.

(56) References Cited

U.S. PATENT DOCUMENTS 6,239,834 B1 * 5/2001 Miyaji et al. ............... 348/193
6,611,231 B2 * 8/2003 Crilly et al. ................. 342/378
6,970,682 B2 * 11/2005 Crilly et al. ................. 455/78
7,516,069 B2 * 4/2009 Bernard et al. ............. 704/233

FOREIGN PATENT DOCUMENTS

CN 1799498 A 7/2006

* cited by examiner

*Primary Examiner*—Brij B Shrivastav
*Assistant Examiner*—Dixomara Vargas

(57) ABSTRACT

The invention discloses a method for calculating the signal-to-noise ratio (SNR) in parallel acquisition image reconstruction, comprising: determining a reconstruction expression for a linear operation of the image reconstruction; determining a weighted coefficient according to the reconstruction expression; calculating the SNR according to the weighted coefficient and the raw data. The SNR not only is relevant to the geometric shape and position of the coils, but also is influenced by the reconstruction method and the sampling mode. The SNR is calculated based on contribution of the raw data at positions in the reading direction from all the phase-coding lines in all acquisition channels. It reflects more precisely the loss of the SNR in the parallel acquisition image reconstruction, especially the changes in the SNR caused by the number of the reference lines combined during the reconstruction.

15 Claims, 3 Drawing Sheets

METHOD FOR CALCULATING SIGNAL-TO-NOISE RATIO IN PARALLEL ACQUISITION IMAGE RECONSTRUCTION

CROSS REFERENCE TO RELATED APPLICATIONS

This application claims priority of Chinese application No. 200710108505.x filed May 17, 2007, which is incorporated by reference herein in its entirety.

FIELD OF THE INVENTION

The present invention relates to magnetic resonance imaging (MRI) technologies, and particularly to a method for calculating signal-to-noise ratio (SNR) in reconstructing images by parallel acquisition (PA).

BACKGROUND OF THE INVENTION

In the MRI technologies, the imaging speed is a very important parameter. Several hours were generally required for an examination in early stages of the technology, and since then the imaging speed has been increased quite significantly owning to the technical improvements in relation to field intensity, gradient hardware and pulse sequences. However, fast changes of field gradient and high density continuous radio frequency (RF) pulses would result in a specific absorption rate (SAR) and the amount of heat generated in organs and tissues which have become unbearably beyond human physiological limits, therefore increasing the imaging speed has met a bottleneck.

Thereafter, researchers found that the speed of magnetic resonance imaging could be greatly increased by virtue of the application of complicated computer aided image reconstruction algorithms together with cooperated coil array, and such a technology was commonly referred to as parallel imaging technology. The reconstruction of parallel-acquired images is a technology for image reconstruction using parallel acquisition, which utilizes the differences in the spatial sensitivities between phase-controlled arrayed coils to perform spatial encoding and utilizes the phase-controlled arrayed coils to acquire data simultaneously, so that when compared with the imaging speed of conventional MRI it obtained an imaging speed of 2 to 6 times higher or even more. By adopting the parallel imaging technology, it has brought forward new requirements to MRI systems; for example, there are needs for multiple receiving channels, multi-arrayed coils and calibration of the sensitivities of the coils, the use of special data processing and image reconstructing methods and so on.

Parallel imaging can increase image acquisition speed and the increase of imaging speed is achieved by reducing the filling rate in K-space. However, if the filling rate in K-space is below the limit by Nyquist theorem, it would lead to the appearance of artifacts in the images reconstructed using direct Fourier reconstruction. The images of common MRI are obtained by acquiring an object's information in frequency domain which is subject to Fourier transformation. According to the Nyquist theorem, an object's repeating cycle in the image domain is in inverse proportion to the sampling interval in the frequency domain. If an image's spatial repeat cycle is smaller than the size of the image itself, the reconstructed images will be superposed, and this phenomenon is referred to in signal processing as overlapping.

As to multi-coil acquisition, although the K-space information acquired by each coil is not sufficient, the differences between the signals acquired by different coils can be utilized and processed to obtain a complete image. The reconstruction algorithms for eliminating overlapped artifacts for parallel imaging can be divided roughly into two categories: the simultaneous acquisition of spatial harmonics technique (SMASH) and the sensitivity encoding parallel acquisition technique (SENSE). Among them, the SMASH method is a method using the sensitivity functions of various channel coils to form spatial harmonics and to perform assistant encoding. The sensitivity function of an ordinary coil is of slow variation and can be regarded as a Gaussian distribution function, and then a linear combination of the sensitivity functions of various channel coils can be used to form spatial harmonics of a certain frequency. And the spatial harmonic function is used to make up a phase encoding line whose data are not actually acquired. Griswold et al. made further improvements to SMASH, and they proposed the generalized autocalibrating partially parallel acquisition (GRAPPA) algorithm. Differing from the fitting by SMASH of the K-space under-sampling data into a final image of full sampling, GRAPPA fits the under-sampled K-space data of each channel. GRAPPA has improved the precision of the reconstructed images while demanding more processing time. Currently, it has been proposed a scheme that taking the reference lines into account in the GRAPPA algorithm, that is to use the low-frequency full-sampled data to substitute the corresponding fitted data when fitting the under-sampled K-space data, so as to improve the SNR of the reconstructed images.

Differing from the processing scheme of SMASH in the frequency domain, the SENSE method removes the artifacts generated by under-sampling by means of solving a linear equation set in the image domain. Because of the overlapping effects due to the spatial cycle of the image, the SENSE method performs full-sampling in the central region of K-space during the data acquisition, and performs under-sampling in the peripheral regions. The raw data of K-space are then divided into two portions: the uniform under-sampled data and low frequency full-sampled data. The uniform under-sampled data are used to produce an overlapped image, while the low frequency full-sampled data are used to produce a blurred image of tissues and further to obtain a real-time sensitivity distribution and weighted matrix of the coils, and finally by synthesizing the overlapped image produced by using of the under-sampled data and the weighted matrix obtained by using of the low frequency full-sampled data, an image of high resolution without overlapping is obtained. Here, the low frequency full-sampled data for obtaining the sensitivity distribution of the coils and the weighted matrix are referred to as reference data, and the phase encoding lines in K-space for low frequency full-sampling are referred to as reference lines. In the present applicant's Chinese patent titled "the method and device for parallel acquisition and image reconstruction", it is described a scheme for performing reconstruction by taking the reference lines into account of the SENSE algorithm, that is to say the reconstruction data are generated according to a hybrid sampling mode to contain the combination of the under-sampled data in K-space and the low-frequency full-sampled data, and the hybrid sampling mode is taken in account during the image reconstruction.

In the present applicant's Chinese patent application no. 200410082376.8, entitled "image reconstruction algorithm for fast and generalized autocalibrating parallel acquisition in MRI imaging", it is described a generalized evaluation algorithm for SNR loss, which can be used in the parallel imaging methods both in image space and in K-space. However, in the evaluation algorithm for SNR loss described above, the contribution of the reference lines to the SNR is not considered.

SUMMARY OF THE INVENTION

The object of the present invention is to provide a method for calculating SNR in parallel acquisition image reconstruction, in which the contribution of reference lines are taken into account in calculating the SNR of parallel acquisition image reconstruction.

To achieve the abovementioned object, the technical solution of the present invention comprises a method for calculating a signal-to-noise ratio in parallel acquisition image reconstruction, comprising: determining a reconstruction expression for the parallel acquisition image reconstruction, so as to make the image reconstruction satisfy a linear operation ρ=Mr, in which ρ is the reconstructed image, M is the reconstruction expression, r is the raw data; determining a weighted coefficient of the image reconstruction according to said reconstruction expression; and calculating the signal-to-noise ratio of a parallel-acquired image according to said weighted coefficient and said raw data.

Said method further comprises: evaluating the loss of the signal-to-noise ratio in the parallel acquisition image reconstruction according to the ratio of the signal-to-noise ratio of the parallel-acquired image to the signal-to-noise ratio of a standard-acquired image as a relative signal-to-noise ratio.

Wherein, said reconstruction expression is a reconstruction matrix.

Wherein, said raw data are the data obtained from K-space by uniform under-sampling.

Wherein, said raw data are the mixed-sampling data obtained by combining uniform under-sampling and low frequency full-sampling in K-space.

Wherein, for a reconstruction method based on K-space, said determining the reconstruction expression of the parallel acquisition image reconstruction comprises: determining a reconstruction matrix for the parallel acquisition image reconstruction: M=C·F·G, in which G represents a K-space data-filling matrix which fills in the uniform under-sampled K-space positions using a fitting coefficient while keeping the low-frequency full-sampled data; C represents a channel combining operation matrix which is equivalent to squared and combined SOS carried out by using the complex conjugations of the sensitivities of coils; and F represents a Fourier transformation matrix.

Wherein, for a reconstruction method based on image space, said determining the reconstruction expression of the parallel acquisition image reconstruction comprises: determining a sampling matrix for parallel imaging: E=U·F$^{-1}$·P, in which E represents the parallel imaging sampling matrix, U represents an under-sampling matrix, F represents a Fourier transformation matrix, and P represents a coil sensitivity distribution matrix; and calculating the inversion of the sampling matrix for parallel imaging to obtain a reconstruction matrix for the parallel acquisition image reconstruction: M=inv (E'·E)·E', in which M represents the reconstruction matrix, and E represents said sampling matrix for parallel imaging.

Wherein, said under-sampling matrix U represents a uniform under-sampling matrix or a mixed mode under-sampling matrix by performing uniform under-sampling and low frequency full-sampling to K-space.

Wherein, for sampling in a rectangular coordinate system, said raw data r comprise all the data at the same positions in the reading direction from different acquisition channels and different phase-coding lines.

Wherein, for sampling in a non-rectangular coordinate system, said raw data comprise all the K-space data from all acquisition channels.

Wherein, for sampling in the rectangular coordinate system, said determining the weighted coefficient of image reconstruction according to said reconstruction expression comprises: if the reading direction is horizontal and the phase-coding direction is vertical, for a pixel (jRO, iPE) with its horizontal position set as jRO and its vertical position set as iPE, its weighted coefficient is determined as: $w_{jRO}^{iPE}=(w_1, w_2, \ldots, w_{nCh\times nPE})$ and its corresponding mathematical expression for reconstruction is: Im $a_{jRO}^{iPE}=w_{jRO}^{iPE}\cdot r_{jRO}$, in which nCh represents the number of acquisition channels, nPE represents the number of phase-coding lines, $w_{jRO}^{iPE}$ represents a row vector for calculating the weighted coefficient of the pixel, $(w_1, w_2, \ldots, w_{nCh\times nPE})$ are all the values in the iPEth row in the reconstruction matrix $M_{jRO}$, $r_{jRO}$ is a column vector composed of the raw data of the same position jRO in the reading direction in K-space from different channels and different phase-coding positions, the reconstruction matrix $M_{jRO}$ is the reconstruction matrix for reconstructing $r_{jRO}$, and Im $a_{jRO}^{iPE}$ is the pixel at the position (jRO,iPE) in the reconstructed image.

Wherein, said calculating the signal-to-noise ratio of the parallel-acquired image according to the weighted coefficient and the raw data comprises:

$$SNR_{jRO}^{iPE} = \frac{|w_{jRO}^{iPE}\cdot r_{jRO}|}{\sqrt{w_{jRO}^{iPE}\cdot \psi \cdot (w_{jRO}^{iPE})'}\sqrt{mPE}},$$

in which $SNR_{jRO}^{iPE}$ represents the signal-to-noise ratio of the pixel (jRO,iPE) of the parallel-acquired image, $w_{jRO}^{iPE}$ represents the weighted coefficient for the image reconstruction, mPE is the number of the actually acquired phase-coding lines, and ψ represents a noise correlation matrix.

It can be seen from above technical solutions that, in the method for calculating the SNR according to the present invention, the image reconstruction is expressed as a linear operation ρ=Mr, the weighted coefficient for image reconstruction is determined according to the reconstruction matrix M, and then the SNR of a parallel-acquired image is calculated according to the weighted coefficient for image reconstruction and the raw data. Therefore, it can be realized in the calculation of the SNR that not only the geometry of the coils is taken into consideration, but also the raw data and the sampling mode are sufficiently considered, and since the contribution of the raw data from all acquisition channels of the respective positions in all phase encoding lines are taken into consideration in the calculation of the signals of each pixel in the image, it is capable of reflecting the SNR loss in the parallel acquisition image reconstruction, especially it is capable of reflecting accurately the variation of the SNR resulted in by the number of the reference lines combined during the reconstruction. Therefore, it makes the evaluation of the SNR loss in the parallel acquisition image reconstruction more accurate.

BRIEF DESCRIPTION OF THE DRAWINGS

In order to make the above-described and other features and the advantages of the present invention clearer to those skilled in the art, the preferred embodiments of the present invention will be described in detail hereinbelow by reference to the accompanying drawings, in which the same reference numerals indicate the same parts, and in which.

DETAILED DESCRIPTION OF THE INVENTION

To make the objects, the technical solutions and the advantages of the present invention more apparent, the present invention will be further described in detail hereinbelow with reference to the accompanying drawings and embodiments. It should be understood that the embodiments described herewith are only intended to explain the present invention and are not to define the present invention.

According to the present invention, when calculating the SNR in the parallel acquisition image reconstruction, the reconstruction expression for the parallel acquisition image reconstruction is determined, the weighted coefficient of the image reconstruction is determined according to the reconstruction expression; and then the SNR in the parallel-acquired image is calculated according to the weighted coefficient and the raw data.

The present invention is illustrated in detail below by way of two embodiments.

Figure 1:
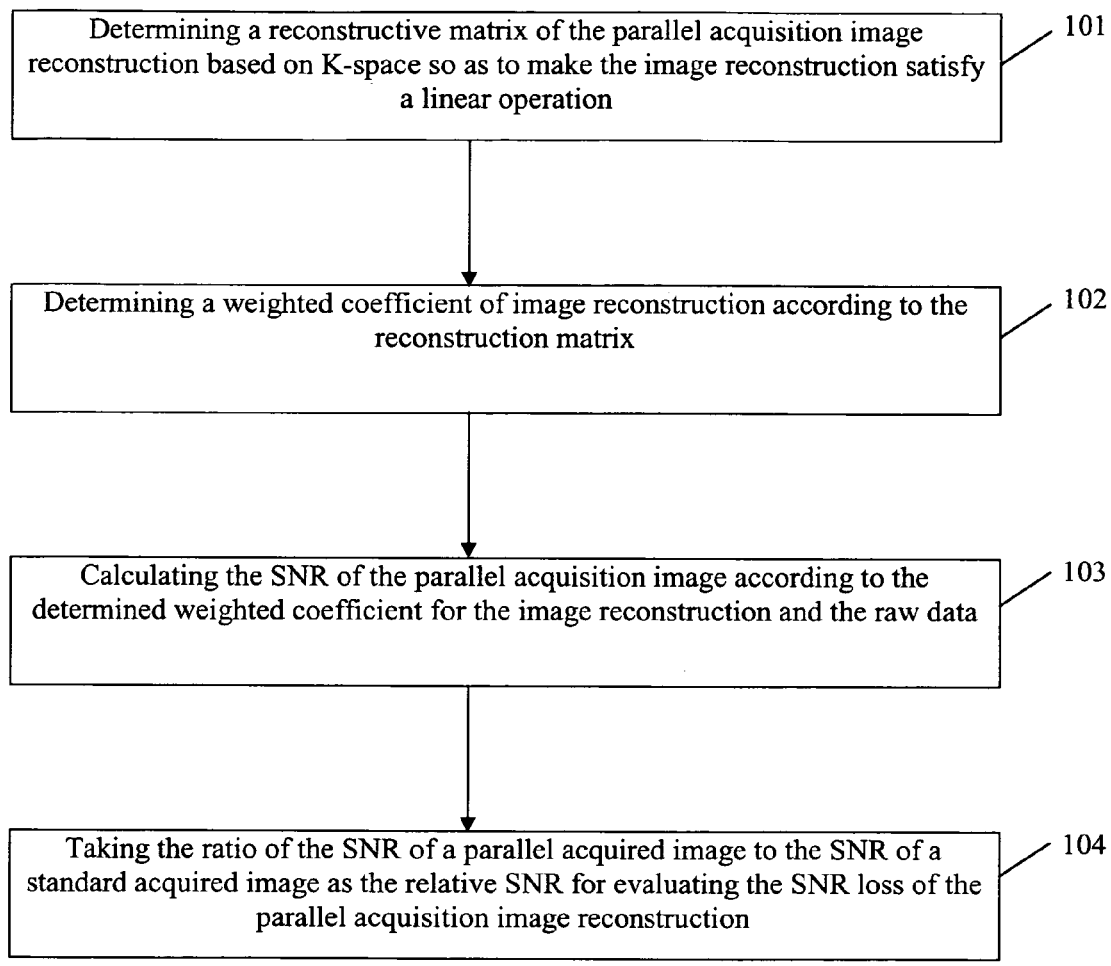
FIG. 1 is a flow chart of the method for calculating the SNR in the parallel acquisition image reconstruction according to a first embodiment of the present invention.

FIG. 1 is the flow chart of the method for calculating the SNR in the parallel acquisition image reconstruction according to the first embodiment of the present invention. This embodiment is used in the parallel acquisition image reconstruction based on K-space, such as the GRAPPA reconstruction method. It can be seen from FIG. 1 that the embodiment mainly comprises the following steps:

Step 101: determining a reconstruction matrix for the parallel acquisition image reconstruction based on K-space, so as to make the image reconstruction satisfy a linear operation $\rho = Mr$, in which $\rho$ is the reconstructed image, M is the reconstruction matrix, and r is the raw data.

When sampling in a rectangular coordinate system, the raw data r for the sampling in the rectangular coordinate system includes all the data at the same positions in the reading direction from different acquisition channels and different phase-coding lines. Generally speaking, the reading direction is the horizontal direction, and the phase encoding direction is the vertical direction. In this embodiment, $\rho$ is a vector of [nPE, 1], representing the jROth column of the reconstructed image; r is a vector of [nPE×nCh, 1], representing all the raw data in the jROth column read from all acquisition channels from 1 to nCh.

The raw data r can be either the data obtained by uniform under-sampling of K-space, or the data obtained by a hybrid sampling mode by combining the uniform under-sampling and the low frequency full-sampling in K-space.

In this embodiment, the reconstruction matrix for the parallel acquisition image reconstruction is determined according to the formula (1):

$$M = C \cdot F \cdot G \tag{1}$$

in which G represents a K-space data-filling matrix which fills in the uniform under-sampled K-space positions using a fitting coefficient while keeping the low frequency full-sampled data; C represents a channel combining operation matrix which is equivalent to squared and combined SOS carried out by using the complex conjugations of the sensitivities of coils; and F represents a Fourier transformation matrix. In this embodiment, F and G are both a matrix of [nPE×nCh, nPE×nCh], and C is a matrix of [nPE, nPE×nCh].

Step 102: determining the weighted coefficient for image reconstruction according to the reconstruction matrix.

Assuming that the reading direction is the horizontal direction and the phase-coding direction is the vertical direction, for a pixel (jRO, iPE) with its horizontal position set as jRO and its vertical position set as iPE, its weighted coefficient is determined as:

$$w_{jRO}^{iPE} = (w_1, w_2, \ldots, w_{nCh \times nPE}) \tag{2}$$

and its corresponding mathematical expression for reconstruction is:

$$Im\, a_{jRO}^{iPE} = w_{jRO}^{iPE} \cdot r_{jRO} \tag{3}$$

in which nCh represents the number of acquisition channels, nPE represents the number of phase-coding lines, $w_{jRO}^{iPE}$ represents a row vector for calculating the weighted coefficient of the pixel, $(w_1, w_2, \ldots, w_{nCh \times nPE})$ are all the numbers in the iPEth row in the reconstruction matrix $M_{jRO}$, $r_{jRO}$ is a column vector composed of the raw data of the same position jRO in the reading direction in K-space from different channels and different phase-coding positions, the reconstruction matrix $M_{jRO}$ is the reconstruction matrix for reconstructing $r_{jRO}$, and $Im\, a_{jRO}^{iPE}$ is the pixel at the position (jRO,iPE) in the reconstructed image.

Step 103: calculating the SNR of the parallel-acquired image according to the determined weighted coefficient for image reconstruction and the raw data.

The SNR of the parallel acquisition image reconstruction is calculated according to the formula (4):

$$SNR_{jRO}^{iPE} = \frac{|w_{jRO}^{iPE} \cdot r_{jRO}|}{\sqrt{w_{jRO}^{iPE} \cdot \psi \cdot (w_{jRO}^{iPE})'} \sqrt{mPE}} \tag{4}$$

in which $SNR_{jRO}^{iPE}$ represents the signal-to-noise ratio of the pixel (jRO,iPE) of the parallel-acquired image, $w_{jRO}^{iPE}$ represents the weighted coefficient for the image reconstruction, mPE is the number of the actually acquired phase-coding lines, and $\psi$ represents a noise correlation matrix.

Step 104: evaluating the loss of the SNR in the parallel acquisition image reconstruction by using the ratio of the SNR of the parallel-acquired image to the SNR of a standard-acquired image as a relative SNR.

The ratio of the SNR of the parallel-acquired image to the SNR of the standard-acquired image is calculated by using the formula (5):

$$SNR^{rel} = \frac{SNR_{jRO}^{iPE}}{SNR^{opt}} \tag{5}$$

wherein $SNR^{opt}$ represents for the maximum SNR, $SNR^{rel}$ represents a relative SNR, that is the SNR efficiency relative to the measurement time.

Since the SNR of each pixel of the reconstructed image is calculated in Step 103, an image of the SNR loss is thereby created, and this image of the SNR loss reflects accurately the SNR resulted from the parallel acquisition image reconstruction, by using this image of the SNR loss, the SNR in the parallel image reconstruction can be evaluated more precisely.

Figure 2:
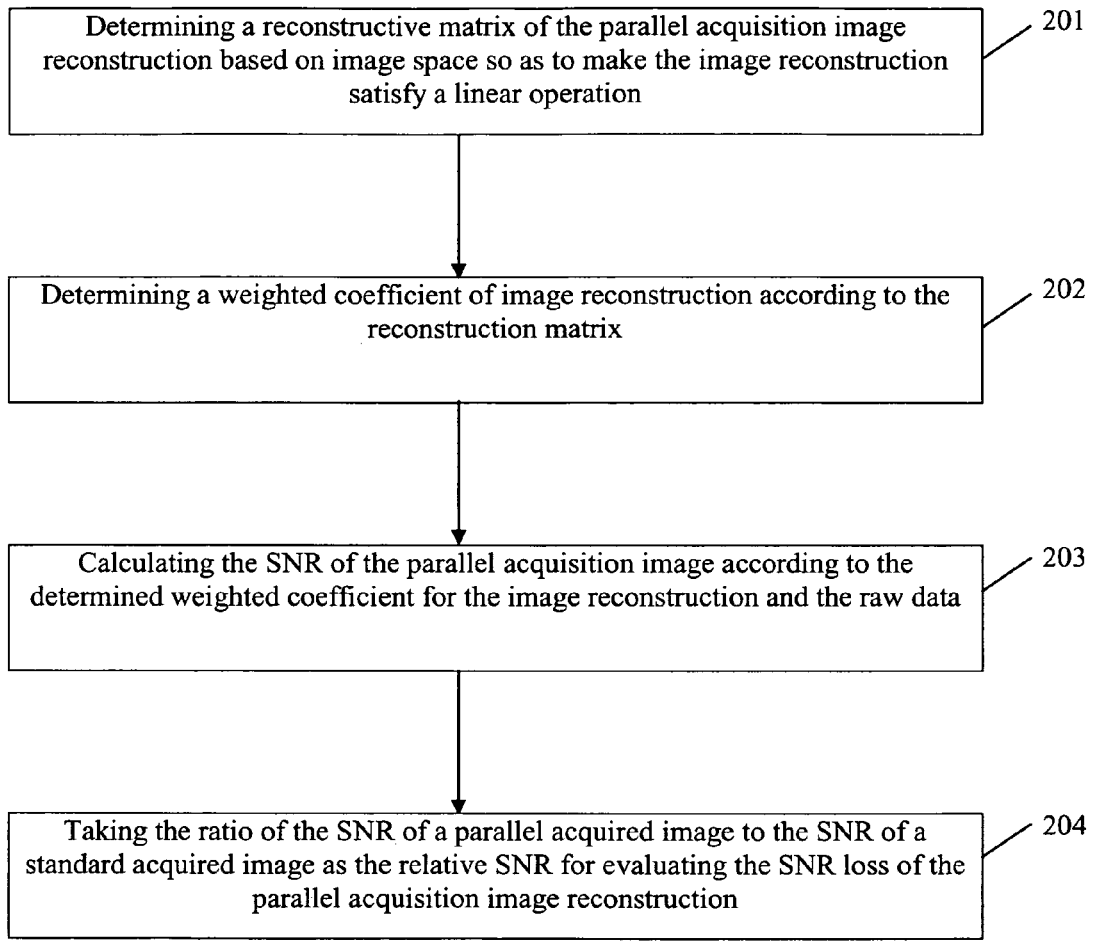
FIG. 2 is a flow chart of the method for calculating the SNR in the parallel acquisition image reconstruction according to a second embodiment of the present invention.

FIG. 2 is the flow chart of the method for calculating the SNR in the parallel acquisition image reconstruction according to the second embodiment of the present invention. This embodiment is used in the parallel acquisition image reconstruction based on the image space, such as the SENSE reconstruction method. It can be seen from FIG. 2 that this embodiment mainly comprises the following steps:

Step 201: determining a reconstruction matrix for the parallel acquisition image reconstruction, so as to make the image reconstruction satisfy a linear operation ρ=Mr, in which ρ is the reconstructed image, M is the reconstruction matrix, and r is the raw data.

In the embodiment, the sampling matrix for parallel imaging is determined by the formula (6):

$$E=U \cdot F^{-1} \cdot P \quad (6)$$

in which E represents the sampling matrix for parallel imaging, U represents an under-sampling matrix, F represents a Fourier transformation matrix, and P represents a coil sensitivity distribution matrix. The under-sampling matrix U can be both a uniform under-sampling matrix and an under-sampling matrix of mixed modes by performing uniform under-sampling and low-frequency full-sampling to K-space.

The inverse of the sampling matrix for parallel imaging is worked out according to the formula (7) so as to obtain the reconstruction matrix of parallel acquisition image reconstruction:

$$M=inv(E' \cdot E) \cdot E' \quad (7)$$

in which M represents the reconstruction matrix, and E represents said sampling matrix for parallel imaging.

Steps 202 to 204 are completely the same as Steps 102 to 104 and will not be further described here.

Disclosed in the above two embodiments are the cases in rectangular coordinate systems, and for the case of sampling in a non-rectangular coordinate system, the raw data r include all K-space data from all the acquisition channels.

It can be seen from the above two embodiments that, in the method for calculating the SNR according to the present invention, the image reconstruction is expressed as a linear operation ρ=Mr, the weighted coefficient of the image reconstruction is determined according to the reconstruction matrix M, and then the SNR of a parallel-acquired image is calculated according to the weighted coefficient of image reconstruction and the raw data. The SNR of a parallel-acquired image not only is relevant to the geometry and position of the coils, but also is affected by the reconstruction method and sampling modes. In the present invention, the contribution of the raw data from all acquisition channels of the corresponding positions in the reading direction of all phase encoding lines are taken into consideration in the calculation of the SNR of the reconstructed image. Therefore, it is capable of reflecting more precisely the SNR loss in the parallel acquisition image reconstruction, especially it is capable of reflecting precisely the changes of the SNR resulted from the number of the reference lines combined during the reconstruction. Therefore, it makes the evaluation of the SNR loss in the parallel acquisition image reconstruction more precise.

Figure 3:
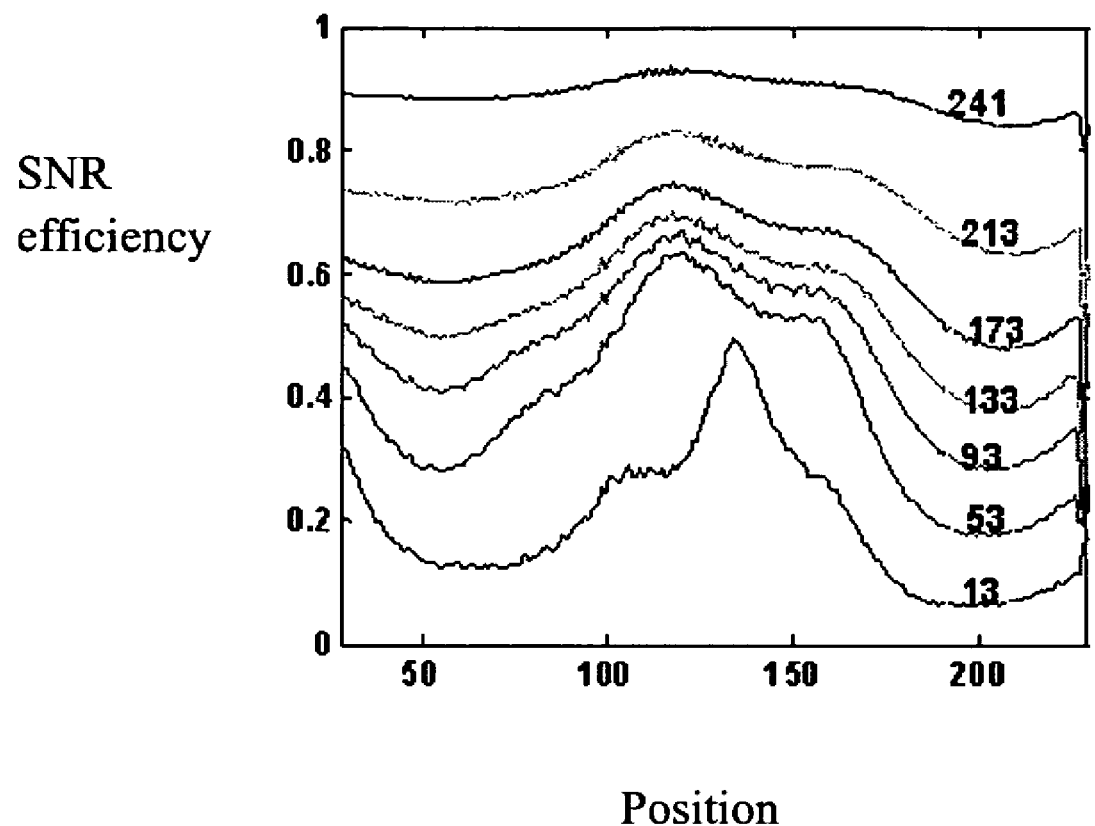
FIG. 3 is a schematic illustration of the SNR calculated by adopting the method according to the present invention, which changes with the change of the reference lines.

FIG. 3 is the schematic illustration of the SNR calculated by using the method according to the present invention, which changes with the change of the reference lines. In this figure the horizontal coordinate is the position of a pixel in the reconstructed image, the vertical coordinate is the SNR efficiency, each curve in the figure represents the differences of the SNR in the reconstructed image resulting from different parameters, and it can be seen from the figure that, the more reference lines are taken into consideration in the reconstruction, the higher the SNR efficiency of the reconstructed image.

It is to be noted that the present invention can be applied in any arrayed coil combination algorithm whose weighted coefficients and sampling modes are known, and are not limited to the GRAPPA method and the SENSE method mentioned in above two embodiments.

Described above are merely the preferred embodiments of the present invention, which are not for limiting the present invention; any modification, equivalent substitution, refinement etc. within the spirit and principles of the present invention should be covered in the scope of protection of the present invention.

The invention claimed is:

1. A method for calculating a signal-to-noise ratio of a parallel-acquired image of an object in a parallel acquisition image reconstruction, comprising:
   acquiring the parallel-acquired image by a MRI device;
   determining a reconstruction expression for a linear operation of the image reconstruction, ρ=Mr, wherein ρ is a reconstructed image of the parallel-acquired image, M is the reconstruction expression, and r is raw data of the parallel-acquired image by an image processing unit;
   determining a weighted coefficient of the image reconstruction according to the reconstruction expression by the image processing unit; and
   calculating the signal-to-noise ratio of the parallel-acquired image according to the weighted coefficient and the raw data by the image processing unit,
   wherein the raw data comprises a uniform under-sampling data in K-space, or
   wherein the raw data comprises a mixed sampling data by combining the uniform under-sampling data and low frequency full-sampling data in the K-space.

2. The method as claimed in claim 1, further comprising evaluating a loss of the signal-to-noise ratio in the parallel acquisition image reconstruction according to a ratio of the signal-to-noise ratio of the parallel-acquired image to a signal-to-noise ratio of a standard-acquired image.

3. The method as claimed in claim 1, wherein the reconstruction expression is a reconstruction matrix.

4. The method as claimed in claim 1, wherein the image reconstruction is calculated on the K-space.

5. The method as claimed in claim 4, wherein the reconstruction expression is determined by a formula: M=C·F·G, wherein:
   G represents a K-space data-filling matrix which fills in uniform under-sampled K-space positions using a fitting coefficient while keeping a low frequency full-sampled data,
   C represents a channel combining operation matrix which is equivalent to squared and combined SOS carried out by using complex conjugation of sensitivity of a coil of the MRI device, and
   F represents a Fourier transformation matrix.

6. The method as claimed in claim 1, wherein the image reconstruction is calculated on image space.

7. The method as claimed in claim 6, wherein the reconstruction expression is an inversion of a sampling matrix: M=inv(E'·E)·E'.

8. The method as claimed in claim 7, wherein the sampling matrix is determined by a formula: $E=U \cdot F^{-1} \cdot P$, wherein:
   U represents an under-sampling matrix,
   F represents a Fourier transformation matrix, and
   P represents a sensitivity distribution matrix of the coil of the MRI device.

9. The method as claimed in claim 8, wherein the under-sampling matrix comprises a uniform under-sampling matrix.

10. The method as claimed in claim 8, wherein the under-sampling matrix comprises a mixed under-sampling matrix by combining uniform under-sampling and low frequency full-sampling in K-space.

11. The method as claimed in claim 1, wherein the raw data comprises data at a same position in a reading direction from different acquisition channels and different phase-coding lines for sampling in a rectangular coordinate system.

12. The method as claimed in claim 11, wherein the reading direction is horizontal and a phase-coding direction is vertical.

13. The method as claimed in claim 12,
wherein a weighted coefficient for a pixel at a position (jRO,iPE) with a horizontal position set as jRO and a vertical position set as iPE is determined by a formula:

$$w_{jRO}^{iPE} = (w_1, w_2, \ldots, w_{nCh \times nPE}), \text{ and}$$

wherein the pixel is determined by a formula: $\text{Im } a_{jRO}^{iPE} = w_{jRO}^{iPE} \cdot r_{jRO}$,
wherein:
nCh represents a number of acquisition channels,
nPE represents a number of phase-coding lines,
$w_{jRO}^{iPE}$ represents a row vector of the weighted coefficient of the pixel at the position (jRO,iPE),
$(w_1, w_2, \ldots, w_{nCh \times nPE})$ represents iPEth row in the reconstruction expression $M_{jRO}$,
$r_{jRO}$ represents a column vector of raw data at a same position of jRO in the reading direction in K-space from different channels and different phase-coding positions, and
$\text{Im } a_{jRO}^{iPE}$ represents the pixel at the position (jRO, iPE) in the reconstructed image.

14. The method as claimed in claim 13, wherein the signal-to-noise ratio of the parallel-acquired image is calculated by a formula:

$$SNR_{jRO}^{iPE} = \frac{|w_{jRO}^{iPE} \cdot r_{jRO}|}{\sqrt{w_{jRO}^{iPE} \cdot \psi \cdot (w_{jRO}^{iPE})'} \sqrt{mPE}},$$

wherein:
$SNR_{jRO}^{iPE}$ represents the signal-to-noise ratio of the pixel at the position (jRO,iPE) of the parallel-acquired image,
mPE represents a number of actually acquired phase-coding lines, and
$\psi$ represents a noise correlation matrix.

15. The method as claimed in claim 1, wherein the raw data comprises K-space data from all acquisition channels for sampling in a non-rectangular coordinate system.

* * * * *